United States Patent
Kim et al.

(10) Patent No.: US 7,187,001 B2
(45) Date of Patent: Mar. 6, 2007

(54) ORGANIC LIGHT EMITTING DISPLAY WITH CIRCUIT MEASURING PAD AND METHOD OF FABRICATING THE SAME

(75) Inventors: Mu-Hyun Kim, Suwon-si (KR); Keum-Nam Kim, Seoul (KR)

(73) Assignee: Samsung SDI Co., Ltd., Suwon (KR)

(*) Notice: Subject to any disclaimer, the term of this patent is extended or adjusted under 35 U.S.C. 154(b) by 84 days.

(21) Appl. No.: 11/019,457

(22) Filed: Dec. 23, 2004

(65) Prior Publication Data
US 2006/0043360 A1   Mar. 2, 2006

(30) Foreign Application Priority Data
Sep. 2, 2004   (KR) .............. 10-2004-0070087

(51) Int. Cl.
    *H01L 29/08* (2006.01)
(52) U.S. Cl. .................. 257/40; 257/59; 257/72
(58) Field of Classification Search ............... 257/40, 257/48, 59, 72
    See application file for complete search history.

(56) References Cited

U.S. PATENT DOCUMENTS

2003/0140982 A1   7/2003   Seki et al.
2003/0180975 A1   9/2003   Fujita
2006/0043360 A1*  3/2006   Kim et al. .............. 257/40

FOREIGN PATENT DOCUMENTS

JP     11-168214        6/1999
WO     WO 2004/062323 A1   7/2004

* cited by examiner

*Primary Examiner*—Mark V. Prenty
(74) *Attorney, Agent, or Firm*—H.C. Park & Associates, PLC

(57) ABSTRACT

An organic light emitting display and method of fabricating the same are disclosed. The light emitting display includes: a substrate having a display region and a circuit measuring pad region; source and drain electrodes arranged above the display region and a first conductive layer arranged above the circuit measuring pad region on the same layer as the source and drain electrodes; a first insulating layer on the source and drain electrodes and the first conductive layer; first and second via holes formed in the first insulating layer, the first via hole exposing the source or drain electrode, the second via hole exposing the first conductive layer; a pixel electrode contacting the source or drain electrode through the first via hole, and a second conductive layer contacting the first conductive layer through the second via hole; and a pixel defining layer which exposes the pixel electrode and formed on the second conductive layer.

9 Claims, 8 Drawing Sheets

ORGANIC LIGHT EMITTING DISPLAY WITH CIRCUIT MEASURING PAD AND METHOD OF FABRICATING THE SAME

CROSS-REFERENCE TO RELATED APPLICATION

This application claims priority to and the benefit of Korean Patent Application No. 2004-70087, filed Sep. 2, 2004, the disclosure of which is incorporated herein by reference in its entirety.

BACKGROUND OF THE INVENTION

1. Field of the Invention

The present invention relates to an organic light emitting display with a circuit measuring pad and method of fabricating the same and, more particularly, to an organic light emitting display with a circuit measuring pad which may prevent a short circuit between the circuit measuring pad and an opposite electrode and method of fabricating the same.

2. Description of the Related Art

Among flat panel displays, an organic light emitting display (OLED) has a fast response speed of 1 ms or less, low power consumption, and a wide viewing angle due to an emissive display, and thus it has an advantage as a medium displaying a moving picture regardless of its size. Also, the OLED may be fabricated at low temperature and has a simplified manufacturing process since it employs the existing semiconductor manufacturing process technologies, and thus it attracts public attention as the next flat panel display.

The OLED is fabricated by forming a thin film transistor (TFT) array having a plurality of TFTs and capacitors on a substrate using a semiconductor manufacturing process, and depositing an organic layer having an emission layer on an emission region of the substrate on which the TFT array is formed.

In the OLED, a silicon semiconductor and metal electrodes are electrically connected to each other through contact holes, and a pixel electrode which is patterned corresponding to each unit pixel is supplied with an electrical current for driving a light emitting element by the TFT connected thereto through a via hole.

Driving circuit measuring pads are arranged at the periphery of a display region in which the unit pixels of the OLED are formed. The driving circuit measuring pads are formed to check if circuit operation of the OLED is normally performed, during a manufacturing process.

However, the driving circuit measuring pad may cause a short circuit with an opposite electrode formed on the display region of the OLED, leading to failure of the OLED and low reliability of the OLED.

SUMMARY OF THE INVENTION

The present invention, therefore, solves aforementioned problems associated with conventional devices by providing a circuit measuring pad which may prevent a short circuit between the circuit measuring pad and an opposite electrode to thereby improve reliability of a display, an OLED with the circuit measuring pad, and method of fabricating the same.

The present invention also provides a method of improving a manufacturing process of the OLED by implementing the OLED having a thin pixel defining layer.

In an exemplary embodiment of the present invention, an organic light emitting display includes: a substrate having a display region and a circuit measuring pad region; source and drain electrodes arranged above the display region, and a first conductive layer arranged above the circuit measuring pad region on the same layer as the source and drain electrodes; a first insulating layer arranged on the source and drain electrodes and the first conductive layer; first and second via holes formed in the first insulating layer, the first via hole exposing the source or drain electrode, the second via hole exposing the first conductive layer; a pixel electrode contacting the source or drain electrode through the first via hole, and a second conductive layer contacting the first conductive layer through the second via hole; and a pixel defining layer which exposes the pixel electrode and formed on the second conductive layer.

In another exemplary embodiment according to the present invention, a method of fabricating an organic light emitting display includes: preparing a substrate having a display region and a circuit measuring pad region; depositing and patterning a conductive layer on the substrate to form a first conductive layer above the circuit measuring pad region while forming source and drain electrodes above the display region; forming a first insulating layer on the source and drain electrodes and the first conductive layer; simultaneously forming first and second via holes in the first insulating layer, the first via hole exposing the source or drain electrode, the second via hole exposing the first conductive layer; depositing and patterning a conductive layer to form a pixel electrode contacting the source or drain electrode through the first via hole, and a second conductive layer contacting the first conductive layer through the second via hole; and depositing and patterning an insulating layer to form a pixel defining layer which exposes the pixel electrode above the display region and covers the second conductive layer above the circuit measuring pad region.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
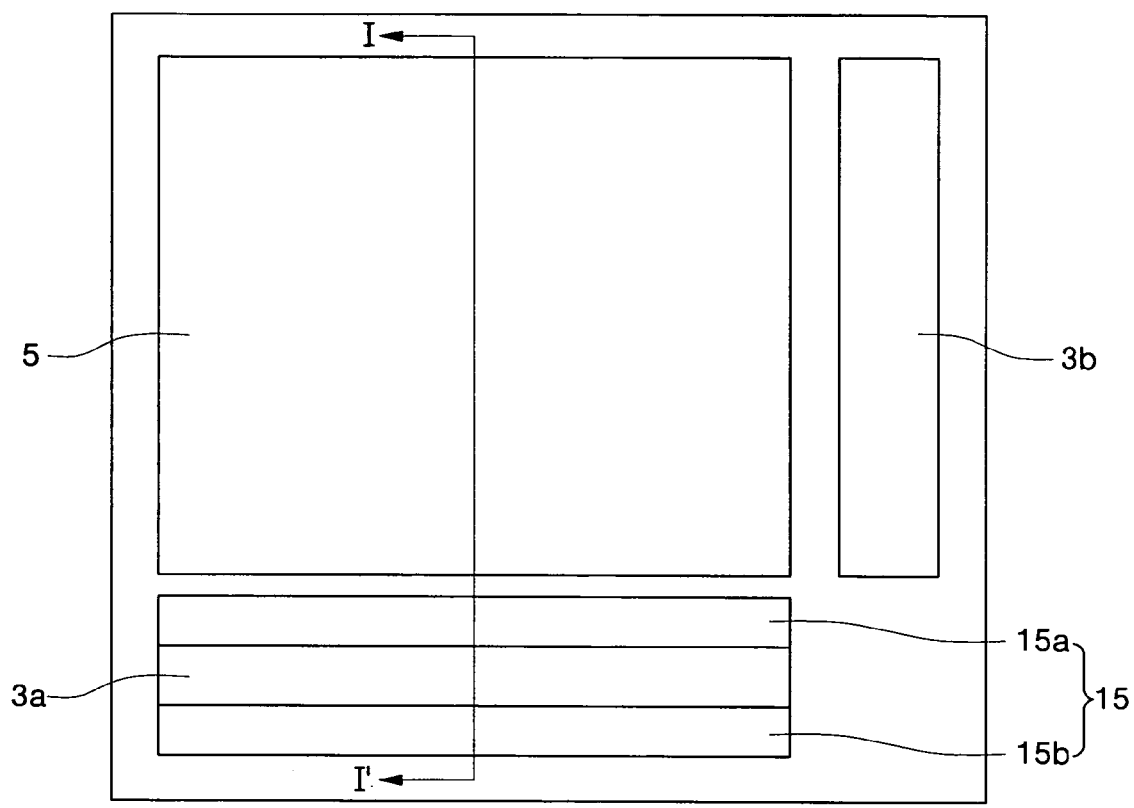
FIG. 1 is a plan view of an OLED according to the present invention.

Reference will now be made in detail to the embodiments of the present invention, examples of which are illustrated in the accompanying drawings, wherein like reference numerals refer to the like elements throughout. The embodiments are described below in order to explain the present invention by referring to the figures.

FIG. 1 is a plan view of an organic light emitting display (OLED) according to the present invention.

Referring to FIG. 1, the OLED includes a display region 5 having unit pixels and circuit portions 3a and 3b for driving the display region 5. The circuit portions 3a and 3b include a data driver region 3a and a scan driver region 3b. Each of the circuit portions 3a and 3b includes thin film transistors (TFTs) corresponding to the respective pixels, and is connected to the display region 5 via an interconnection line. Scan lines and data lines are arranged in the display region 5 to transfer signals from the data driver region 3a and the scan driver region 3b of the circuit portions 3a and 3b, and each signal is applied to a designated pixel to operate the OLED.

A circuit measuring pad 15 may be arranged on a region 15a between an emission region and the data driver region 3a or on one side 15b of an edge of the OLED. The circuit measuring pad 15 is formed at the same time as the TFTs in the OLED. The circuit measuring pad 15 is connected to the data lines, and thus it is possible to determine if circuit operation is normally performed by checking electrical characteristics through the circuit measuring pad 15.

Figure 5:
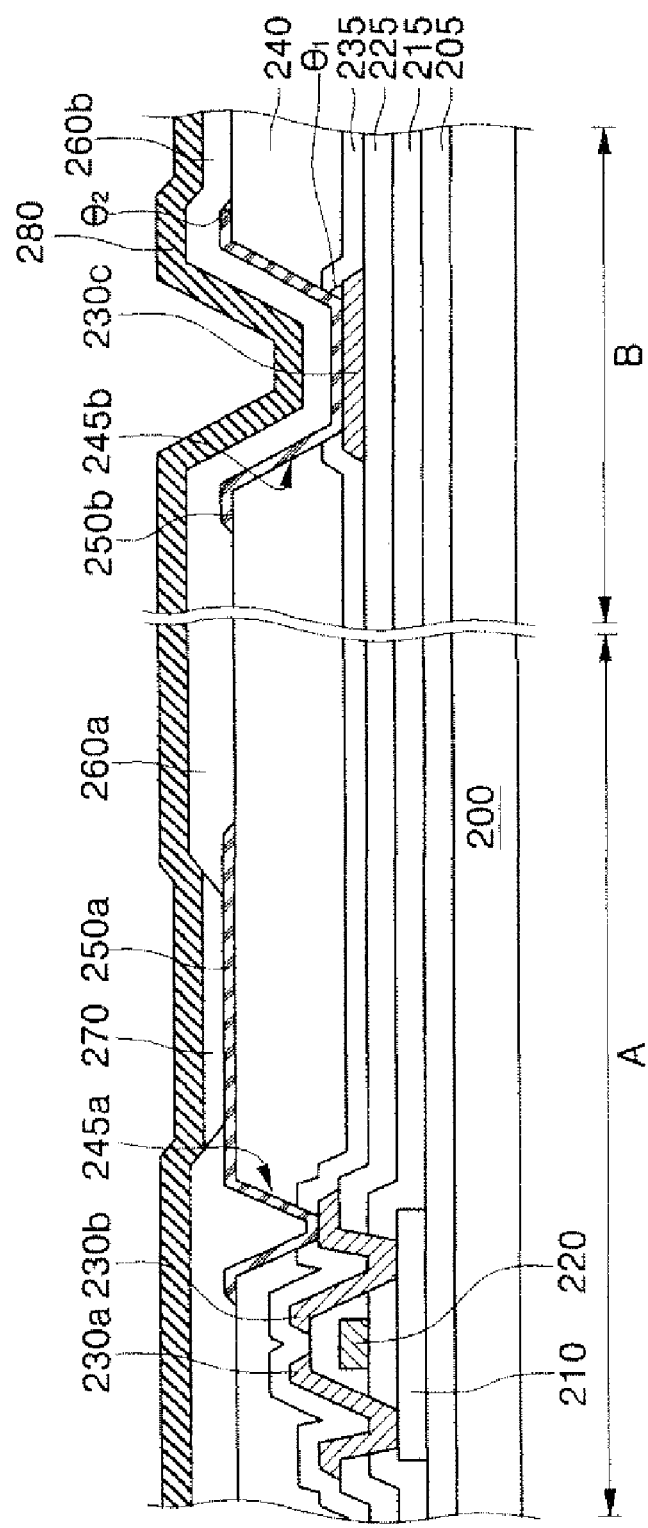

FIG. 5 is a cross-sectional view of an OLED according to a first embodiment of the present invention, taken along the line I–I' in FIG. 1.

Referring to FIG. 5, a substrate 200 includes a display region A and a circuit measuring pad region B.

A buffer layer 205 is arranged on the display region A and the circuit measuring pad region B, and a TFT is arranged on the buffer layer 205 of the display region A. The TFT includes a semiconductor layer 210, a gate insulating layer 215, a gate electrode 220, an inter insulating layer 225, and source and drain electrodes 230a and 230b.

Insulating layers which are deposited at the same time as the gate insulating layer 215 and the interlayer insulating layer 225 are arranged on the buffer layer 205 of the circuit measuring pad region B.

A first conductive layer 230c is arranged on the interlayer insulating layer 225 of the circuit measuring pad region B.

A first insulating layer is arranged on the source and drain electrodes 230a and 230b and the first conductive layer 230c. The first insulating layer may be a passivation layer 235. The first insulating layer may further include a planarization layer 240.

A first via hole 245a which exposes the source electrode 230a or the drain electrode 230b and a second via hole 245b which exposes the conductive layer 230c are arranged in the first insulating layer. A pixel electrode 250a which is in contact with the source electrode 230a or drain electrode 230b through the first via hole 245a and a second conductive layer 250b which is in contact with the first conductive layer 230c through the second via hole 245b are arranged.

A taper angle θ1 of the second via hole 245b may be 50° or less.

Thickness of the second conductive layer 250b may be in a range of 100 to 1,000 Å.

A taper angle θ2 of an edge of the second conductive layer 250b may be 50° or less.

A pixel defining layer 260a which exposes the pixel electrode 250a is arranged, an organic layer 270 having an emission layer is arranged on the exposed pixel electrode 260a. A pixel defining layer 260b is also arranged on the second conductive layer 250b. The pixel defining layers 260a and 260b are formed of thin layers and preferably have a thickness of 3,000 Å or less.

An opposite electrode 280 is arranged on the pixel defining layers 260a and 260b.

Even though the pixel defining layers 260a and 260b are formed of thin layers, since the taper angles θ1 and θ2 are 50° or less, an insulating layer may be formed to a uniform thickness even on a tapered portion, thereby preventing a short circuit between the circuit measuring pad and the opposite electrode.

Therefore, the OLED having the thin pixel defining layer may be implemented, and such a structure may improve characteristics of a laser induced thermal imaging process of the OLED.

Also, reliability of the OLED may be improved by preventing the short circuit.

FIGS. 2 to 5 are cross-sectional views illustrating a method of fabricating an OLED according to the present invention.

Figure 2:
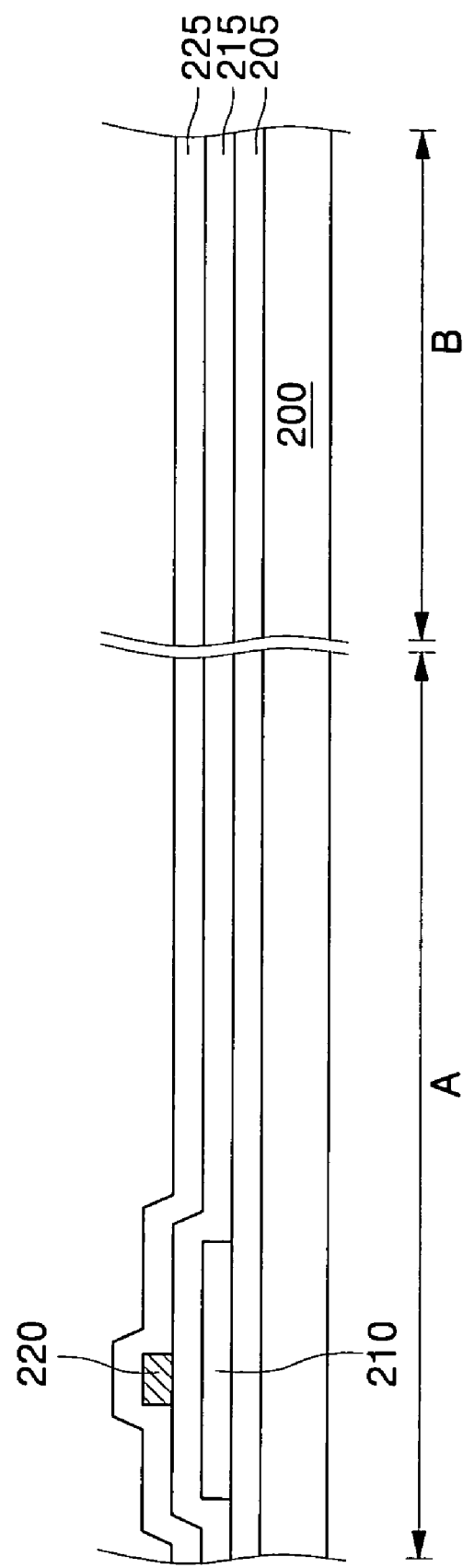
FIGS. 2 to 5 are cross-sectional views taken along the line I–I' in FIG. 1, which illustrate a method of fabricating an OLED according to a first embodiment of the present invention.

Referring to FIG. 2, a buffer layer 205 is formed on a substrate 200 having a display region A and a circuit measuring pad region B. Forming the buffer layer 205 is not necessary, but since it serves to prevent impurities from being come into a TFT element from the substrate 200, it is preferable that the buffer layer 205 is formed. The buffer layer 205 may be formed of silicon nitride (SiNx), silicon oxide ($SiO_2$) or silicon oxynitride ($SiO_xN_y$).

A semiconductor layer 210 is formed on a portion of the buffer layer 205 corresponding to the display region A. The semiconductor layer 210 may be formed of amorphous silicon or crystalline silicon.

A gate insulating layer 215 is formed over the substrate 200 having the semiconductor layer 210. The gate insulating layer 215 is formed of a typical insulating layer such as a silicon oxide ($SiO_2$) layer. A gate electrode 220 is formed over the substrate 200 having the gate insulating layer 215.

Figure 3:
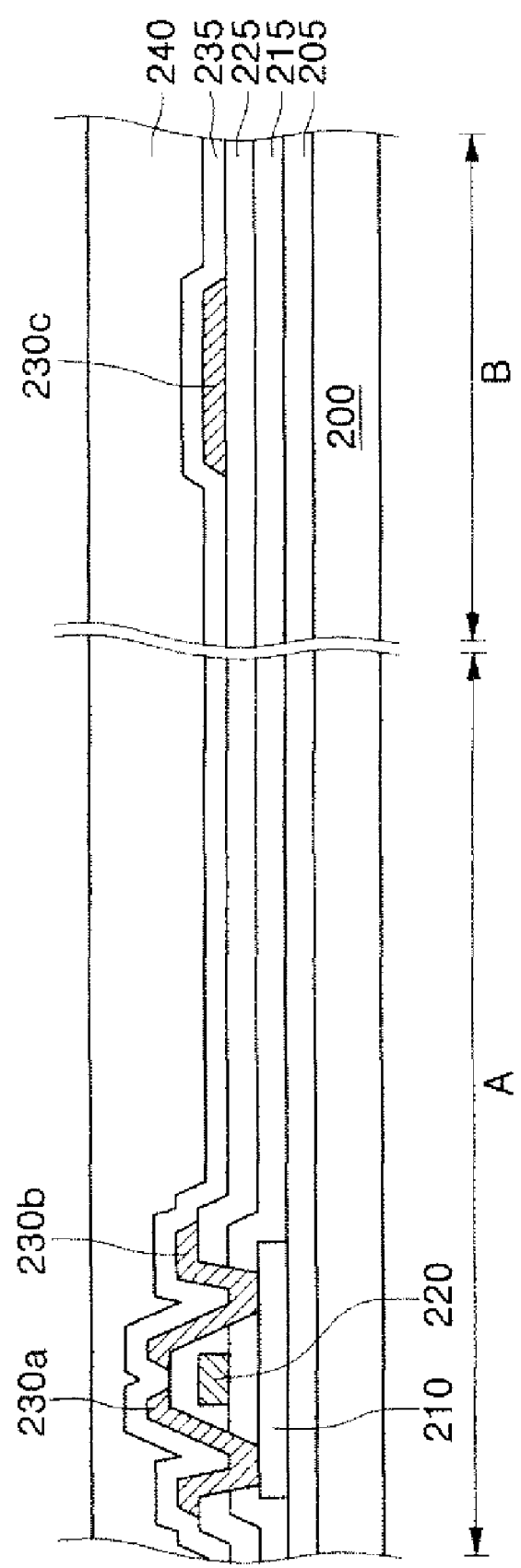

Referring to FIG. 3, an inter insulating layer 225 is formed over the substrate 200 having the gate electrode 220. Contact holes are formed in the inter insulating layer 225 to expose source and drain regions of the semiconductor layer 210, respectively. A conductive layer is deposited and patterned on the interlayer insulating layer 225 to form source and drain electrodes 230a and 230b which are in contact with the exposed source and drain regions respectively while forming a first conductive layer 230c above the circuit measuring pad region B.

A first insulating layer is formed over the substrate 200 having the source and drain electrodes 230a and 230b and the first conductive layer 230c.

The first insulating layer may be a passivation layer 235. The passivation layer 235 may be formed of a silicon nitride (SiNx) layer or silicon oxide ($SiO_2$) layer. The passivation layer 235 is preferably formed of a silicon nitride (SiNx) layer for passivation effect and light blocking effect of the semiconductor layer 210.

A planarization layer 240 may be formed on the passivation layer 235. The planarization layer 240 may be formed of a material selected from a group consisting of polyacrylates resin, epoxy resin, phenolic resin, polyamides resin, polyimides resin, unsaturated polyesters resin, polyphenylenethers resin, polyphenylenesulfides resin, and benzocyclobutene (BCB).

Figure 4:
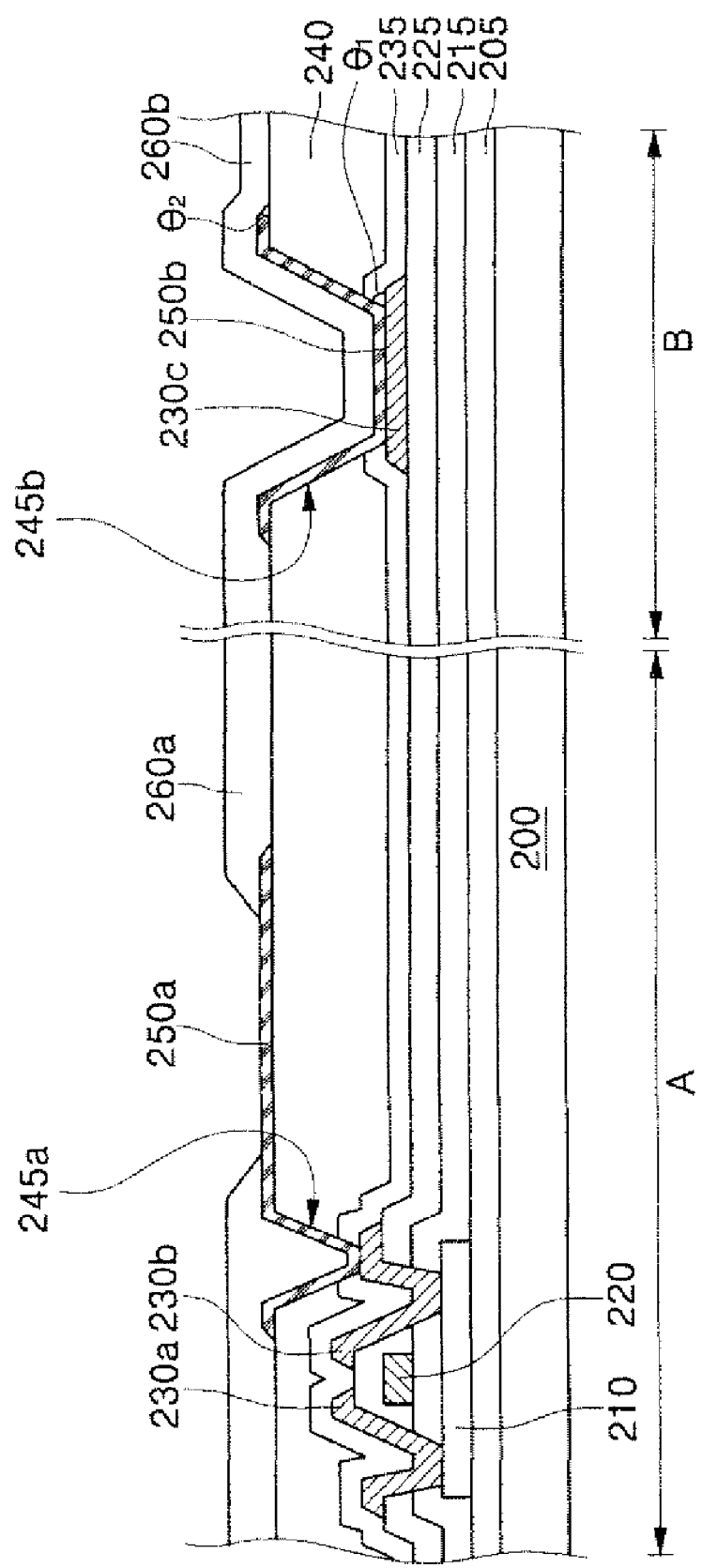

Referring to FIG. 4, first and second via holes 245a and 245b are formed in the first insulating layer to expose the drain electrode 230b and the first conductive layer 230c.

A taper angle θ1 of the first or second via hole may be 50° or less.

A conductive layer is deposited and patterned over the substrate 200 having the first and second via holes 245a and 245b to form a pixel electrode 250a and a second conductive layer 250b on the first and second via holes 245a and 245b, respectively.

The electrical characteristics of the circuit measuring pad region B on which the second conductive layer 250b is formed is checked to see if circuit operation is normally performed.

A reflecting layer may be interposed between the pixel electrode 250a and the planarization layer 240.

The pixel electrode 250a and the second conductive layer 250b may be formed of indium tin oxide (ITO) or indium zinc oxide (IZO). A taper angle θ2 of an edge of the second conductive layer 250b may be 50° or less.

An insulating layer is formed on the pixel electrode 250a and the second conductive layer 250b. The insulating layer is patterned to form pixel defining layers 260a and 260b. The pixel defining layer 260a exposes the pixel electrode 250a, and the pixel defining layer 260b covers and protects the second conductive layer 250b.

Due to the taper angles θ1 and θ2, the pixel defining layer 260b formed above the circuit measuring pad region B may be conformably formed without being broken.

Referring to FIG. 5, an organic layer 270 is formed on the exposed pixel electrode 250a. The organic layer 270 includes at least one selected from a group consisting of a hole injection layer, a hole transport layer, a hole blocking layer, and an electron injection layer in addition to an emission layer.

An opposite electrode 280 is formed on the organic layer 270 of the display region A and the pixel defining layer 260b of the circuit measuring pad region B, thereby completing the OLED.

Therefore, the pixel defining layer 260b is conformably formed without being broken and thus prevents a short circuit between the circuit measuring pad and the opposite electrode 280.

As a result, the OLED having a thin pixel defining layer may be implemented, and a laser induced thermal imaging process of the OLED to which the thin pixel defining layer should be subjected may be easily performed.

Also, since a short circuit is prevented, reliability of the OLED may be improved.

Figure 6:
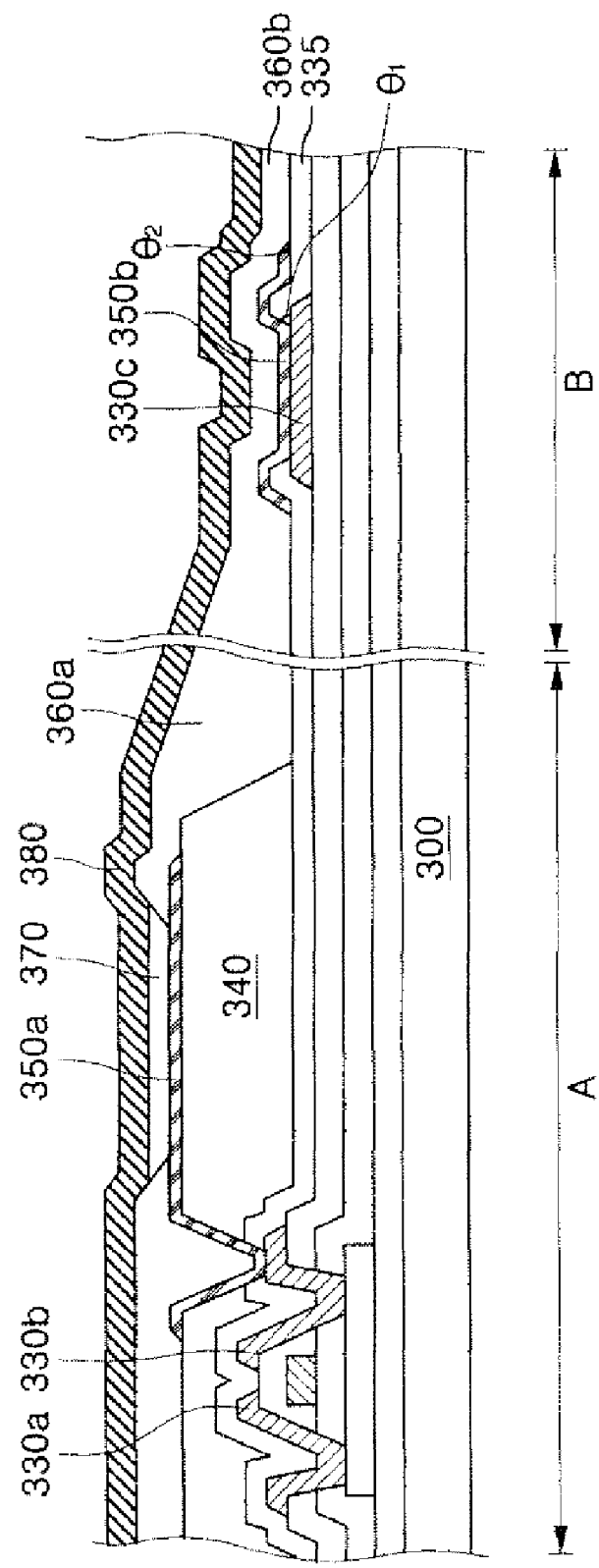
FIGS. 6 to 8 are cross-sectional views illustrating a method of fabricating an OLED according to a second embodiment of the present invention.

FIG. 6 is a cross-sectional view of an OLED according to a second embodiment of the present invention.

Referring to FIG. 6, like the first embodiment of the present invention, a substrate 300 includes a display region A on which source and drain electrodes 330a and 330b are arranged and a circuit measuring pad region B on which a first conductive layer 330c is arranged.

A first insulating layer is arranged on the source and drain electrodes 330a and 330b and the first conductive layer 330c. The first insulating layer may be a passivation layer 335. In the second embodiment of the present invention, a planarization layer 340 is formed above only the display region A except the circuit measuring pad region B.

A taper angle θ1 of a second via hole may be 50° or less.

Thickness of a second conductive layer 350b may be in a range of 100 to 1,000 Å.

A taper angle θ2 of an edge of the second conductive layer 350b may be 50° or less.

A second insulating layer 360b arranged to cover the second conductive layer 350b may be formed of a thin layer having a thickness of 3,000 Å or less.

Therefore, like the first embodiment of the present invention, even though a pixel defining layer 360b is a thin layer, since a taper angle θ1 of the via hole and a taper angle θ2 of an edge of the second conductive layer 350b are 50° or less, the pixel defining layer 360b may be formed to a uniform thickness even at a tapered portion, thereby preventing a short circuit between the circuit measuring pad B and an opposite electrode 380.

As a result, the OLED having a thin pixel defining layer may be implemented, and a laser induced thermal imaging process of the OLED to which the thin pixel defining layer should be subjected may be easily performed. Also, since a short circuit is prevented, reliability of the OLED may be improved.

Figure 7:
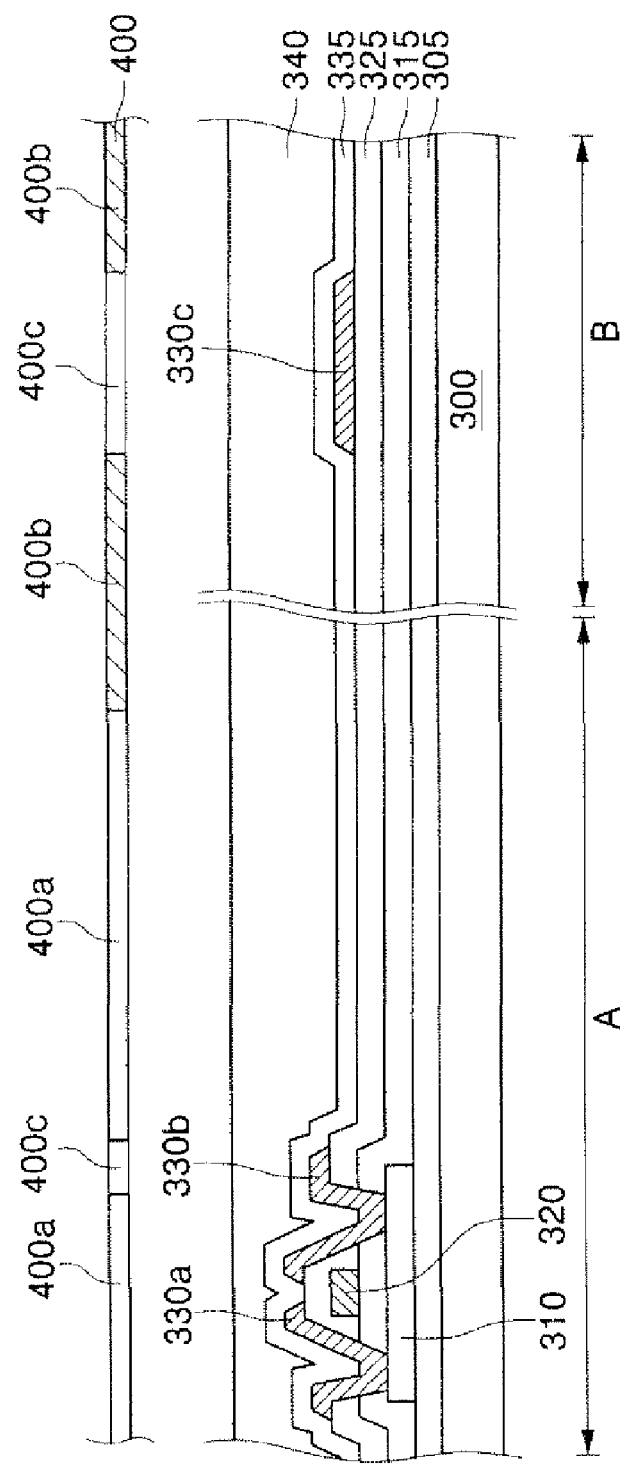
Figure 8:
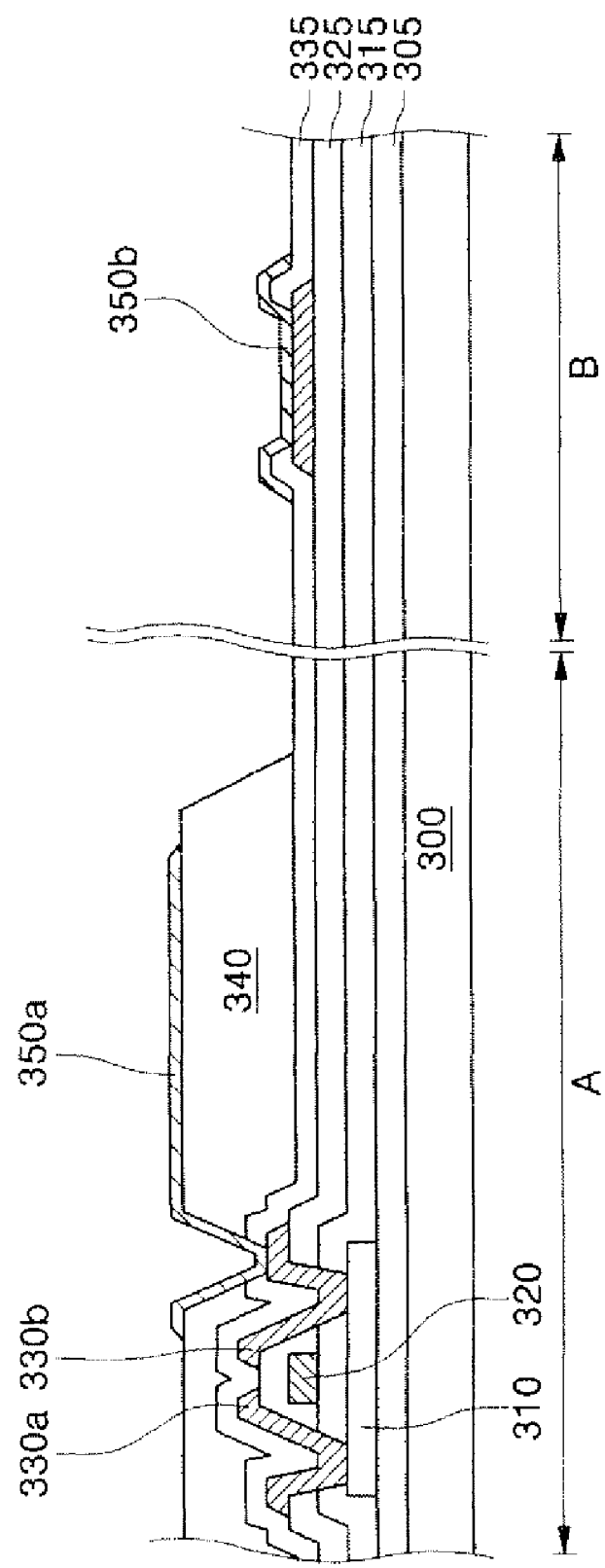

FIGS. 6 to 8 are cross-sectional views illustrating a method of fabricating an OLED according to a second embodiment of the present invention.

Referring to FIG. 7, like the first embodiment, a buffer layer 305 is formed on a substrate 300 having a display region A and a circuit measuring pad region B. A semiconductor layer 310, a gate electrode 320, and source and drain electrodes 330a and 330b are formed on a portion of the buffer layer 305 above the display region A, thereby forming a TFT.

Like the first embodiment, a first conductive layer 330c is formed at the same time as the source and drain electrodes 330a and 330b, above the circuit measuring pad region B. Then, a first insulating layer is formed over the substrate having the source and drain electrodes 330a and 330b and the first conductive layer 330c. The first insulating layer may be a passivation layer 335.

A planarization layer 340 may be formed on the passivation layer 335.

The planarization layer 340 is subjected to an exposure process using a halftone mask 400 which has portions 400a to 400c different in exposure level based on via holes of the display region and the circuit measuring pad region, and portions of the display regions and the circuit measuring pad region around the via holes.

Referring to FIG. 8, by the exposure process, a first via hole which exposes the drain electrode 330b and a second via hole which exposes the first conductive layer 330c are formed while forming an opening which exposes the circuit measuring pad region in the planarization layer 340. That is, using the halftone mask 400, a portion of the planarization layer 340 corresponding to the display region A remains, and a portion of the planarization layer 340 corresponding to the circuit measuring pad region B is removed.

A taper angle θ1 of the first or second via hole may be 50° or less.

A conductive layer is deposited over the substrate having the first and second via hole and then patterned to form a pixel electrode 350a on the first via hole and a second conductive layer 350b on the second via hole.

The electrical characteristics of the circuit measuring pad portion B on which the second conductive layer 350b is formed are checked to see if circuit operation is normally performed.

Like the first embodiment of the present invention, a reflecting layer may be interposed between the pixel electrode 350a and the planarization layer 340.

Also, the pixel electrode 350a and the second conductive layer 350b may be formed of ITO or IZO, and a taper angle of an edge of the second conductive layer 350b may be 50° or less.

Referring to FIG. 6, an insulating layer is formed on the pixel electrode 350a and the conductive layer 350b. The insulating layer is patterned to form pixel defining layers 360a and 360b. The pixel defining layer 360a exposes the pixel electrode 350a, and the pixel defining layer 360b covers and protects the second conductive layer 350b.

Due to the taper angles θ1 and θ2, the pixel defining layer 360b formed above the circuit measuring pad region B may be conformably formed without being broken.

An organic layer 370 is formed on the exposed pixel electrode 350a. The organic layer 370 includes at least one selected from a group consisting of a hole injection layer, a hole transport layer, a hole blocking layer, and an electron injection layer in addition to an emission layer.

An opposite electrode 380 is formed on the organic layer 370 of the display region A and the pixel defining layer 360b of the circuit measuring pad region B, thereby completing the OLED.

Therefore, the pixel defining layer 360b is conformably formed without being broken and thus prevents a short circuit between the circuit measuring pad and the opposite electrode 380.

As a result, the OLED having a thin pixel defining layer may be implemented, and a laser induced thermal imaging process of the OLED to which the thin pixel defining layer should be subjected may be easily performed.

Also, since a short circuit is prevented, reliability of the OLED may be improved.

As described above, the OLED of the present invention may prevent a short circuit between the circuit measuring pad and the opposite electrode even at the tapered portion of the circuit measuring pad due to its uniform thickness. The OLED having a thin pixel defining layer may be implemented, and characteristics of the laser induced thermal imaging process of the OLED may be improved. Also, since a short circuit is prevented, reliability of the OLED may be improved.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display comprising:
   a substrate having a display region and a circuit measuring pad region;
   source and drain electrodes arranged above the display region, and a first conductive layer arranged above the circuit measuring pad region on the same layer as the source and drain electrodes;
   a first insulating layer arranged on the source and drain electrodes and the first conductive layer;
   first and second via holes formed in the first insulating layer, the first via hole exposing the source or drain electrode, the second via hole exposing the first conductive layer;
   a pixel electrode contacting the source or drain electrode through the first via hole, and a second conductive layer contacting the first conductive layer through the second via hole; and
   a pixel defining layer which exposes the pixel electrode and formed on the second conductive layer.

2. The display of claim 1, wherein the second conductive layer has a thickness in a range of 100 to 1,000 Å.

3. The display of claim 1, wherein the pixel defining layer has a thickness of 3,000 Å or less.

4. The display of claim 1, wherein the second via hole has a taper angle of 50° or less.

5. The display of claim 1, wherein an edge of the first conducive layer has a taper angle of 50° or less.

6. The display of claim 1, wherein the first insulating layer is a passivation layer.

7. The display of claim 6, wherein the first insulating layer further includes a planarization layer arranged on the passivation layer.

8. The display of claim 7, wherein the second via hole has a taper angle of 50° or less.

9. The display of claim 7, wherein the planarization layer includes an opening which exposes the circuit measuring pad region, and the second via hole is arranged in the passivation layer.

* * * * *